United States Patent [19]

Rapaich

[11] Patent Number: 4,631,749
[45] Date of Patent: Dec. 23, 1986

[54] ROM COMPENSATED MICROPHONE

[75] Inventor: Mark Rapaich, Stevensville, Mich.

[73] Assignee: Heath Company, St. Joseph, Mich.

[21] Appl. No.: 623,647

[22] Filed: Jun. 22, 1984

[51] Int. Cl.$^4$ .............................................. H03G 5/00
[52] U.S. Cl. .................................... 381/103; 381/101; 381/122
[58] Field of Search ................... 381/56, 103, 57, 122, 381/94, 71; 84/345

[56] References Cited

U.S. PATENT DOCUMENTS

| | | | |
|---|---|---|---|
| 4,315,319 | 2/1982 | White | 381/94 |
| 4,375,776 | 3/1983 | Okamoto | 84/345 |
| 4,458,362 | 7/1984 | Berkovitz et al. | 381/103 |
| 4,489,442 | 12/1984 | Anderson et al. | 381/122 |
| 4,504,968 | 3/1985 | Kaneko et al. | 381/103 |
| 4,549,289 | 10/1985 | Schwartz et al. | 381/71 |

Primary Examiner—Forester W. Isen

[57] ABSTRACT

A microphone is provided with a read only memory (ROM) which is programmed to compensate for the microphone's nonlinear frequency response characteristic during their integration into a single unit. The ROM is thus programmed to provide a frequency response complementary to that exhibited by the microphone. The microphone may have a relatively poor frequency response over the audio spectrum, i.e., 20 Hz–20 kHz, but with the ROM serving to calibrate the microphone, the combination exhibits a relatively flat frequency response over this frequency range. Intended for use in a portable, battery operated, microprocessor-controlled audio spectrum analyzer, the integrated microphone and ROM combination is coupled to a CMOS random access memory (RAM) in which the calibration contents of the ROM are stored. During normal operation, the microprocessor reads the microphone calibration data from the thus programmed RAM in order to conserve battery power, but may read this data from the ROM when necessary. This permits an inexpensive microphone to be used in a high performance audio spectrum analyzer resulting in a flat frequency response.

11 Claims, 3 Drawing Figures

ROM COMPENSATED MICROPHONE

CROSS-REFERENCE TO RELATED APPLICATION

This application is related to but in no way dependent upon the following application which is assigned to the assignee of the present application: Ser. No. 625,950, filed June 29, 1984, entitled "Audio Spectrum Analyzer Operable in a Difference Mode", in the name of Mark Rapaich.

BACKGROUND OF THE INVENTION

This invention relates generally to audio signal processing and is particularly directed to an arrangement for compensating for nonlinear operating characteristics of a microphone.

The intensity of sound is defined as the average rate of sound energy transmitted in a specified direction through a unit area normal to this direction at the point considered. Sound intensity is usually measured in decibels (dB's), in which case it is known as the intensity level and is equal to 10 times the logarithm (to the base 10) of the ratio of the sound intensity to a reference level. The sound itself is caused by pressure changes, or vibrations, characterized as having intensity (loudness) and pitch (frequency). The frequency range over which these sound-generating pressure vibrations are audible is termed the audio spectrum which covers approximately 20 Hz-20kHz.

A microphone is an electroacoustic transducer which responds to sound waves and delivers essentially equivalent electric waves in the form of signals for recording, amplification, broadcasting, measurement, etc. Ideally the microphone will have a uniform pressure response for all frequencies and directions. However, in reality the operating characteristics of microphones vary with frequency and are nonlinear over the audio spectrum. This characteristic degrades the audio signal even before it is subjected to other variations in the signal processing circuitry coupled to the microphone.

In the past, the technique used for most real time spectrum analyzers has been to provide a calibrated input to the microphone during its assembly by means of a test fixture. The microphone response is then manually adjusted over each of the operating frequency bands to provide a substantially uniform signal output. This procedure is time consuming and therefore expensive and is subject to human error. In addition, the microphone and its associated audio signal processing circuitry are now inseparable requiring the microphone to be recalibrated if any changes are made to the integrated combination. Finally, this type of microphone calibration arrangement is subject to drift with time and use particularly where the calibration is accomplished by means of manually adjustable potentiometers as is frequently the case.

The present invention is intended to overcome the aforementioned problems and limitations of the prior art by providing a read only memory (ROM) compensated microphone wherein the ROM is programmed to provide a response which is precisely complementary to the response of the microphone such that when the two components are combined the result is a flat frequency response across the entire audio spectrum. The integrated ROM and microphone combination thus provides a linear operating characteristic over this frequency range in the audio signal processing device in which it is used.

OBJECTS OF THE INVENTION

Accordingly, it is an object of the present invention to provide for the uniform response of a microphone over the entire audio spectrum.

It is another object of the present invention to provide a microphone precisely calibrated over each ⅓ octave of the audio spectrum over which a flat frequency response is achieved.

Yet another object of the present invention is to provide a microphone arrangement which is calibrated to provide linear performance over the audio spectrum when assembled and does not require subsequent alignment or compensation.

A further object of the present invention is to provide a microphone arrangement which exhibits a flat frequency response over the audio spectrum utilizing an inexpensive microphone possessing a relatively low performance characteristic.

A still further object of the present invention is to provide for the automatic calibration of a microphone in an audio signal processing device.

Another object of the present invention is to provide a read only memory calibrated microphone in a microprocessor controlled audio spectrum analyzer.

Still another object of the present invention is to reduce power consumption in a battery operated, portable audio spectrum analyzer.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, in which:

DETAILED DESCRIPTION OF THE PREFERRED EMBODIMENT

Figure 1:
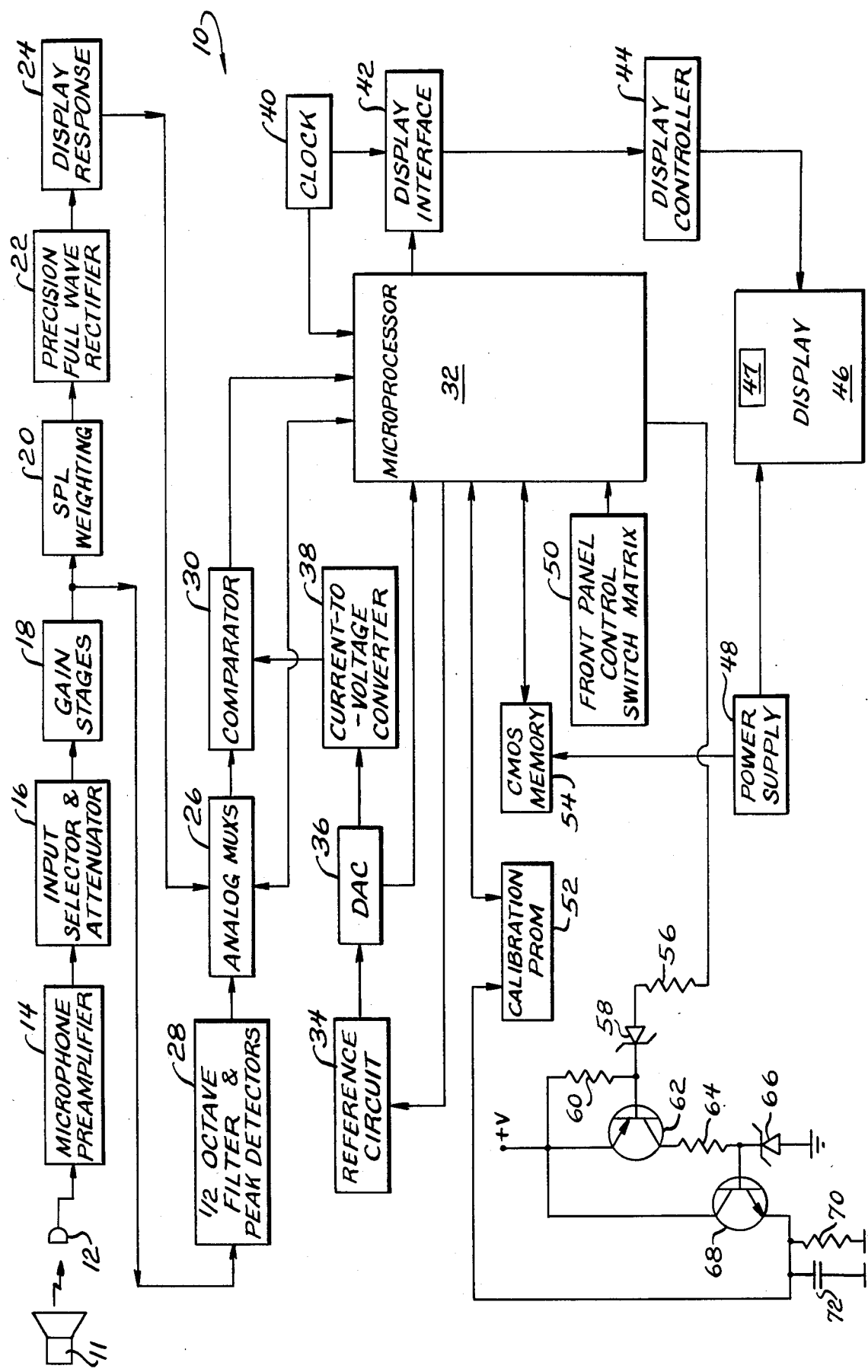
FIG. 1 is a combined schematic and block diagram of a system for compensating for the nonlinear frequency response of a microphone by means of a programmable read only memory in accordance with the present invention.

Referring to FIG. 1, there is shown in combined block and schematic diagram form a read only memory (ROM) compensated microphone system 10 in accordance with the present invention.

A sound source 11, such as a speaker, transmits an audio signal which is received by microphone 12. Virtually any conventional microphone may be used in the ROM compensated microphone system 10. Although not shown in FIG. 1, for simplicity sake, the microphone 12 as well as various other components of the ROM compensated microphone system 10 are understood to be coupled to a conventional DC power supply which is shown as element 48. The output of the microphone 12 is provided to a low-noise preamplifier circuit 14, the gain and calibration of which is set by a selected resistor (not shown) in a conventional manner. The microphone preamplifier 14 adjusts the gain of the ROM compensated microphone system 10 to correct for variations in microphone sensitivity which might cause errors in sound pressure level (SPL) indications discussed below.

An input selector and attenuator 16 is coupled to the microphone preamplifier 14 for receiving the amplified output therefrom. The input selector and attenuator 16 permits the sensitivity of the ROM compensated microphone system 10 to be adjusted in 10 dB steps up or down. In addition, the input selector and attenuator 16 permits an audio signal to be provided directly to the ROM compensated system 10 without transiting microphone 12. However, since this aspect of the ROM compensated microphone system 10 does not form a part of the present invention, it is not shown in FIG. 1 and is not discussed herein.

The output of the selector and attenuator 16 is provided to a plurality of gain stages 18 which amplify the received audio signal to the levels necessary to properly display them. The gain of each of the gain stages 18 is selected to ensure that the bandwidth error at 20 kHz is less than 0.2 dB in the worst case combination of parts tolerances. At the output of the gain stages 18 is a low-pass filter (not shown) for providing a filtered output to an SPL weighting circuit 20 and to analog multiplexers 26.

The SPL weighting circuit 20 provides two selectable weighting functions as defined by the American National Standards Institute (ANSI) standard SI.4-1971 (rev. 1976). A-weighting and C-weighting functions are performed by the SPL weighting circuit 20. A low impedance output is provided from the SPL weighting circuit 20 to a precision full wave rectifier 22 to ensure asymmetrical waveform measurement accuracy. The output from the full wave rectifier circuit 22 is provided to a display response circuit 24 which includes two filter circuits with different response time constants and to a peak detector circuit (not shown). The response time constants of the fast and slow filter circuits are selected to meet the requirements of ANSI specifications for sound level meters (SI.3-1971). Both characteristics are implemented by simple RC filters and their outputs are provided to an SPL response switch (not shown), the output of which is provided to three analog multiplexers 26 which are used to switch the desired DC voltage from the SPL, or the filter outputs, to the comparator 30 which is the input to an analog-to-digital converter.

The output of the gain stages 18 is not only provided to the SPL weighting circuit 20, but is also provided to a plurality of ⅓ octave filter and peak detector circuits 28. The basic ⅓ octave filter and peak detector circuits 28 are identical for each band except for the values of the frequency-determining resistors and capacitors (not shown) which are selected to yield maximum gain at the center frequency in each of the designated bands. In a preferred embodiment, twenty ⅓ octave filter and peak detector circuits are provided to cover the entire audio spectrum. The center frequencies of each of these filter and peak detector combinations in a preferred embodiment are shown in Table I.

TABLE I

| 31.5 Hz |

TABLE I-continued

| 45.0 " |
| 63.0 " |
| 90.0 " |
| 125.0 " |
| 355.0 " |
| 710.0 " |
| 1.0 KHz |
| 1.4 " |
| 2.0 " |
| 2.8 " |
| 4.0 " |
| 5.6 " |
| 8.0 " |
| 11.5 " |
| 16.0 " |
| 20.0 " |

The outputs of the ⅓ octave filter and peak detectors 28 are provided to three analog multiplexers 26 which are used to switch the desired DC voltage from the SPL, or the filter outputs, to comparator 30 under the control of microprocessor 32 as described below. The DC voltages representing the analyzed audio signals to be displayed must first be converted to digital numbers in order to permit the microprocessor 32 to convert them to a readable display value. This conversion is accomplished by means of an 8-bit digital-to-analog converter (DAC) 36 in generating a DC voltage which is under the control of the microprocessor 32. This voltage is compared to the input DC level and the microprocessor 32 is signalled by the comparator 30 when the level is matched. A reference circuit 34 under the control of microprocessor 32 sources reference currents to the DAC 36. In one embodiment, the voltage source for the reference circuit 34 is obtained from a 5 VDC analog power supply, which is divided down by means of a resistive network (not shown). The 8-bit DAC 36 thus provides a DC current which is under the control of the microprocessor 32 to a current-to-voltage converter 38 in response to the reference current output from the reference circuit 34. The output current from the DAC 36 must be converted to a voltage in order to permit the comparator 30 to compare it to the input voltage from the analog multiplexers 26. This is accomplished by means of the current to voltage converter circuit 38 coupled between the DAC 36 and the comparator 30.

The comparator 30 is a high speed comparator which compares the received audio signal from the analog multiplexers 26 with the output voltage from the DAC 36. When the output voltage from the DAC 36 exceeds the input voltage from the analog multiplexers 26, the output of the comparator 30 goes high. The output of the comparator 30 is monitored by the microprocessor 32 to determine the progress of a conversion. The comparator 30 thus compares the voltage state of one of the filter and peak detectors 28 and the microprocessor 32 changes the output voltage of the DAC 36 until it is equal to the input voltage to the comparator 30 from the filter and peak detectors 28. When this occurs, the microprocessor 32 establishes the input voltage to the comparator 30 which represents the received audio signal within a given band as determined by the output of the ⅓ octave filter and peak detectors 28.

Digital circuitry within the ROM compensated microphone system 10 is comprised primarily of microprocessor 32, a clock 40, a calibration programmable read only memory (PROM) 52, a complementary-metal-oxidesilicon (CMOS) random access memory (RAM)

54, and a display interface 42. The clock 40 provides a 3.5 MHz square wave to the microprocessor 32 and to the display interface 42. The clock 40 is comprised of an oscillator circuit having a duty cycle established by two RC timing networks (not shown). The display interface 42 accepts data from the microprocessor 32 in the form of 8-bit words (or bytes) and converts these to the serial data and synchronized clock signals required by the display controller 44. The display interface 42 includes an 8-bit parallel-to-serial converter as well as a counter for controlling a shift register in generating a synchronized clock signal for the display controller 44. The display controller 44 receives the serial data from the output of the shift register in the display interface 42 and a clock signal from its counter output. The display controller 44 provides serial data as well as timing signals to the display 46. In a preferred embodiment, the display 46 is a vacuum fluorescent dot matrix which operates much like a cathode ray tube (CRT). A hot wire filament emits a beam of electrons which is accelerated by a positive potential toward a phosphorous screen in the form of a plurality of dots which emit visible light when struck by the electron beam. It is in this manner that video information representing the spectrum of the audio signals received by the microphone 12 is visually displayed in the ROM compensated microphone system 10 of the present invention. The display 46 is energized by a power supply 48 which provides both DC and AC voltages thereto.

The calibration PROM 52 is coupled to the microprocessor 32 and is programmed in accordance with the inverse frequency response characteristic of the microphone 12. The microphone 12 and calibration PROM 52 are a matched pair and are calibrated as a unit prior to incorporation in the ROM compensated microphone system 10 as described below with respect to FIG. 3. Once calibrated as a unit, the microphone 12 and calibration PROM 52 become an inseparable pair in an integrated unit. The calibration PROM 52 is programmed to provide a frequency response which is precisely complementary to the response of the microphone 12 such that when the two are combined, the result is a flat response across the entire audio spectrum. The microprocessor 32 reads the information thus programmed into the calibration PROM 52 and stores this information in the CMOS memory 54 to be used when necessary. Because the CMOS memory 54 requires only a small portion of the current needed for operation of the calibration PROM 52, during normal operation the programmed information required for proper calibration of the microphone 12 within each of the bands shown in Table I is provided from the CMOS memory 54 to the microprocessor 32. Power to the CMOS memory 54, as well as to the various other components of the ROM compensated microphone system 10, is provided by the power supply 48. Where the ROM compensated microphone system 10 is contemplated for use in a portable audio signal processing device such as a portable audio spectrum analyzer, the power supply 48 may be in the form of a battery with appropriate electronic voltage regulators, for energizing the various components of the ROM compensated microphone system 10.

The power supply for the calibration PROM 52 is comprised primarily of PNP transistor 62, grounded Zener diode 66, and NPN transistor 68. When the microprocessor 32 needs to read the contents of the calibration PROM 52 such as for the initial programming of the CMOS memory 54 or when the CMOS memory 54 does not contain valid calibration data, the microprocessor 32 pulls the base of transistor 62 low by means of an output provided thereto via resistor 56 and Zener diode 58. A +V voltage from power supply 48 is applied to the emitter of transistor 62 with resistor 60 coupled across its emitter-based junction for proper biasing thereof. In response to a low output from microprocessor 32 to its base, transistor 62 turns on and supplies current to grounded Zener diode 66 via resistor 64. This turns on the emitter-follower transistor 68 which acts as a buffer for Zener diode 66 and supplies the Zener voltage (less the junction drop) to the calibration PROM 52. Grounded resistor 70 and capacitor 72 provide filtering for the supply voltage provided to the calibration PROM 52 from Zener diode 66. It is in this manner that the calibration PROM 52 is energized to permit microprocessor 32 to read the calibration data stored therein. Once the microprocessor 32 is provided with the microphone calibration data either from CMOS memory 54 during normal operation or from the calibration PROM 52 when the CMOS memory does not contain valid data, the microprocessor 32 provides appropriate outputs to the reference circuit 34 for controlling the DAC 36 to permit the microprocessor 32 to determine the received signal level from comparator 30.

Figure 2:
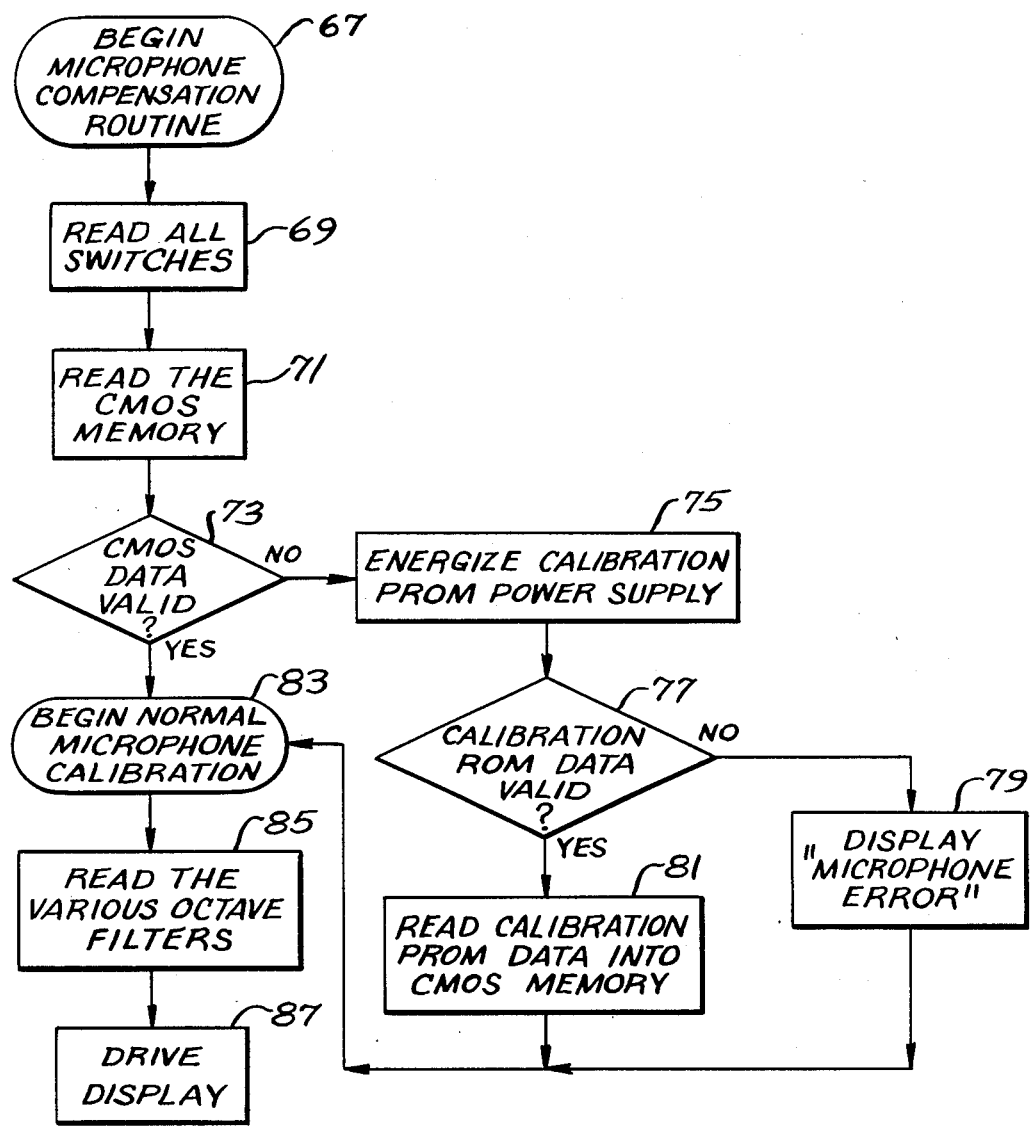
FIG. 2 is a flow chart illustrating the sequence of operations carried out by a microprocessor in controlling the frequency compensated microphone system of FIG. 1.

Referring to FIG. 2, there is shown a flow chart illustrating the operations carried out by microprocessor 32 in the ROM compensated microphone system 10 of the present invention. The microprocessor 32 in a preferred embodiment of the present invention is a 3870 microprocessor which is widely used and well known to those skilled in the art. Upon turn on, or power-up, of the ROM compensated microphone system 10, the microprocessor 32 begins execution of the microphone compensation routine at step 67 as shown in FIG. 2. Initially, the microprocessor 32 reads the status of the switches in the front panel control switch matrix 50 at step 69. The microprocessor next, at step 71, reads the contents of the CMOS memory 54 and checks the status of the data stored therein. The validity of the data stored in the CMOS memory 54 is checked by means of a standard "check-sum" routine wherein the microprocessor 32 compares the data stored in the CMOS memory 54 with a number stored within the microprocessor 32 and determines whether the CMOS memory data is valid. Data stored within the CMOS memory 54 may become invalid for various reasons such as an interruption in the input provided to the CMOS memory 54 from the power supply 48. The validity of the data stored in the CMOS memory 54 is determined as just described at step 73 by microprocessor 32.

If the microprocessor determines that the microphone calibration data stored within the CMOS memory 54 is invalid, the microprocessor 32 energizes the calibration PROM 52 via transistors 62 and 68 and Zener diode 66 as previously described. This is accomplished at step 75 and is followed by a check by the microprocessor of the validity of the microphone calibration data stored in the calibration PROM 52 at step 77. The data in the calibration PROM 52 is checked in a manner similar to the previously described check of the CMOS memory data by performing a check-sum stored data validity check. If it is determined at step 77 that the data stored within the calibration PROM 52 is invalid, the microprocessor 32 illuminates a MICROPHONE ERROR message 47 on the display 46 in order to alert the user that data displayed upon the display 46 does not include compensation for the nonlinear frequency response of the microphone 12. Following illumination of the MICROPHONE ERROR message 47 at step 79, the program initiates normal microphone calibration at step 83, which calibration does not include a microphone compensation factor. If at step 77 it is determined that the data stored in the calibration PROM 52 is valid, the microprocessor reads the data from the calibration PROM and stores this data in the CMOS memory 54 at step 81. Following storage of valid microphone calibration data in the CMOS memory 54, the program then proceeds to step 83 and begins normal microphone calibration using the valid data stored in the CMOS memory 54.

If at step 73, the microprocessor 32 determines that the microphone calibration data stored in the CMOS memory 54 is valid, the program stored in the microprocessor proceeds to step 83 where normal microphone calibration is initiated. Microphone calibration involves the reading of the contents of the various ⅓ octave filter and peak detectors 28 at step 85 by microprocessor 32 and the providing of this information in appropriate form via the display interface 42 and the display controller 44 for presentation on the display 46. The microprocessor 32 scans and reads each of the twenty filter/peak detector combinations and converts the data thus read to a log scale for generating a correction signal which is provided to the reference circuit 34 as previously described.

Figure 3:
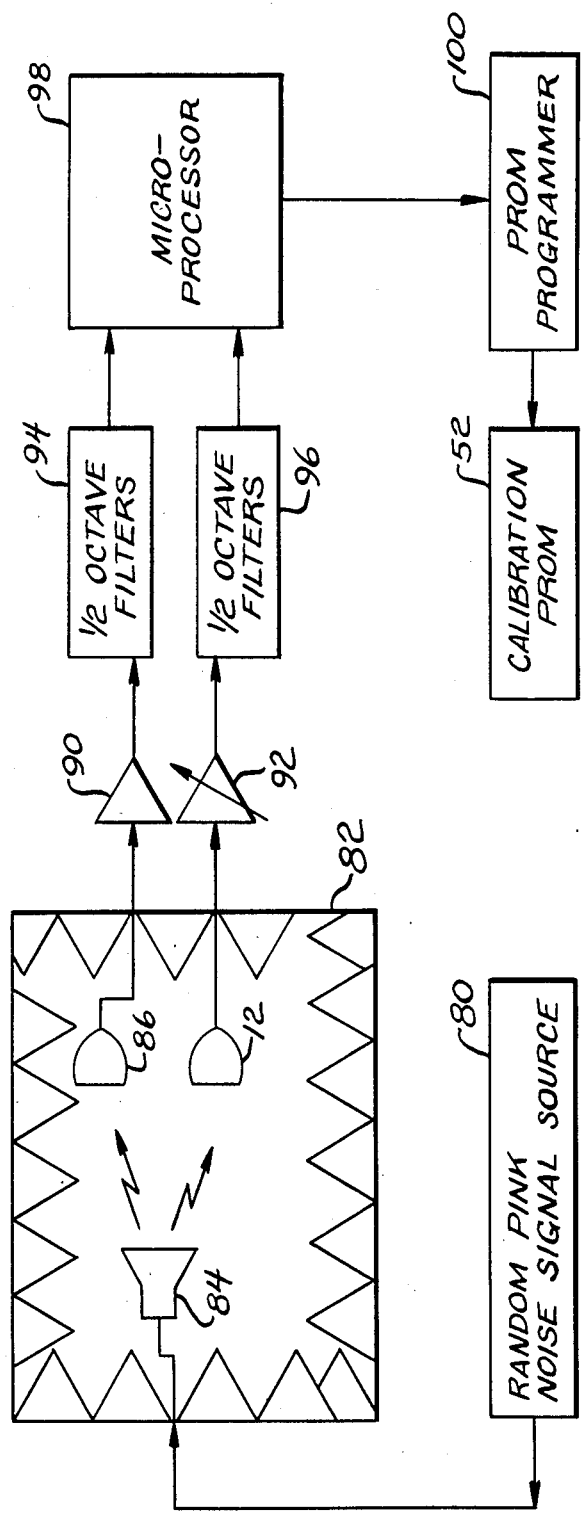
FIG. 3 is a simplified schematic diagram of an arrangement for programming a read only memory for use in the frequency compensated microphone system of FIG. 1.

Referring to FIG. 3, there is shown in simplified schematic diagram form a PROM calibration system 78 for use in programming the calibration PROM 52 with frequency response data characteristic of the operation of microphone 12. The microphone 12 being calibrated, or the test microphone, is positioned within an anechoic chamber 82 within which are also located a source of acoustic signals such as a transducer 84 and a reference microphone 86. A pink noise signal source 80 is coupled to the transducer 84 for providing signals having frequencies over the audio spectrum. The audio signals are received by the test microphone 12 as well as the reference microphone 86 and are respectively provided to calibrated variable and fixed amplifiers 92, 90. The output of the variable and fixed amplifiers 92, 90 are respectively provided to calibrated ⅓ octave filter sets 96 and 94 and thence to microprocessor 98. The SPL output of the test microphone 12 may be amplitude adjusted to match the output of the reference microphone 86 by means of the variable amplifier 92. Microprocessor 98 then compares the respective outputs from the reference microphone 86 and the test microphone 88 and provides appropriate control signals to a PROM programmer 100. In a preferred embodiment, microprocessor 98 is a 3870 microprocessor programmed in a conventional manner to compare two inputs and provide appropriate outputs in response to this comparison. The output from microprocessor 98 is provided to a conventional PROM programmer 100 for the generation of appropriate control inputs which are provided to the calibration PROM 52 for use in the present invention. The calibration PROM 52 used in a preferred embodiment is a Signetics 82S129 PROM, the programming of which can be accomplished by a number of commercially available, conventional PROM programmers as well known to those skilled in the art. The thus programmed calibration PROM 52 and the test microphone 12 then form a matched pair for use in the ROM compensated microphone system of the present invention.

There has thus been shown an arrangement for compensating for the nonlinear frequency response of a microphone by means of a read only memory programmed to provide a response which is complementary to the microphone's frequency response such that when the two are combined, the result is a flat frequency response across the entire audio spectrum. The ROM may be calibrated in a conventional manner using readily available calibration equipment and is provided with a similarly programmed CMOS memory for reducing the power requirements in the ROM compensated microphone system.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A system for compensating for the nonlinear frequency response of a microphone in an audio signal processing apparatus, said system comprising:
   conversion means coupled to said microphone for converting an audio signal received by said microphone to a digital signal;
   memory means for storing data representing a frequency response complementary to the nonlinear frequency response of said microphone;
   signal processing means coupled to said conversion means and to said memory means for respectively receiving and reading said digital audio signal and said complementary frequency response data therefrom and for combining said digital audio signal and said complementary frequency response data for generating a linearly compensated audio signal independent of the microphone's environment, wherein the microphone and said memory means form a frequency compensated matched pair.

2. A system in accordance with claim 1 wherein said memory means comprises a first primary memory and a second standby memory, wherein said complementary frequency response data is stored in said first primary and second standby memories, with said first primary memory used during normal operation and said second standby memory used in a back-up mode of operation.

3. A system in accordance with claim 2 wherein said first primary memory comprises a random access memory and said second standby memory comprises a programmable read only memory.

4. A system in accordance with claim 2 further comprising a power supply coupled between said signal processing means and said second standby memory for the actuation thereof when the data stored in said first primary memory is invalid.

5. A system in accordance with claim 4 wherein said power supply is actuated by said signal processing means following the detection by said signal processing means of invalid complementary frequency response data in said first primary memory.

6. A system in accordance with claim 1 further comprising display means coupled to said signal processing means for providing a visual display of the compensated audio spectrum of the received signal.

7. A system in accordance with claim 1 further comprising visual indicator means coupled to said signal processing means for providing a visual indication when the nonlinearity of said microphone is not being compensated for.

8. A system in accordance with claim 1 wherein said audio signal processing apparatus is portable and includes a battery for the energization thereof.

9. A system in accordance with claim 1 wherein said audio signal processing apparatus is an audio spectrum analyzer.

10. A system in accordance with claim 9 wherein said audio spectrum analyzer is portable and includes a battery for the energization thereof.

11. A system in accordance with claim 1 wherein said complementary frequency response data is arranged in said memory means for providing microphone frequency response compensation over a plurality of ½ octave frequency bands covering the audio spectrum.

* * * * *